US010069492B2

(12) United States Patent
Ho

(10) Patent No.: US 10,069,492 B2
(45) **Date of Patent: *Sep. 4, 2018**

(54) FORWARD ISOLATION IN RADIO-FREQUENCY SWITCHES USING INTERNAL REGULATOR

(71) Applicant: SKYWORKS SOLUTIONS, INC., Woburn, MA (US)

(72) Inventor: Chu-hsiung Ho, Milpitas, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,362

(22) Filed: Sep. 7, 2017

(65) Prior Publication Data

US 2018/0013420 A1 Jan. 11, 2018

Related U.S. Application Data

(63) Continuation of application No. 14/839,774, filed on Aug. 28, 2015, now Pat. No. 9,871,512.

(60) Provisional application No. 62/043,833, filed on Aug. 29, 2014.

(51) Int. Cl.
*H03K 17/687* (2006.01)
*H04L 25/02* (2006.01)

(52) U.S. Cl.
CPC ....... *H03K 17/687* (2013.01); *H04L 25/0266* (2013.01)

(58) Field of Classification Search
CPC .......................... H03K 17/687; H04L 25/0266
See application file for complete search history.

(56) References Cited

U.S. PATENT DOCUMENTS 7,199,635 B2 * 4/2007 Nakatsuka ........... H03K 17/102 327/308
8,742,502 B2 * 6/2014 Brindle ............. H01L 29/78609 257/347
8,954,902 B2 * 2/2015 Stuber ................. H01L 27/1203 716/100
9,225,378 B2 * 12/2015 Burgener .................. H01P 1/15
9,577,626 B2 * 2/2017 Crandall ................ H03K 17/04
9,847,774 B2 * 12/2017 Crandall .......... H03K 3/356104
2002/0024375 A1 * 2/2002 Asano ................. H01L 27/0605 327/365
2003/0090313 A1 * 5/2003 Burgener .................. H01P 1/15 327/408
2004/0041551 A1 * 3/2004 Mottola .................. G05F 3/267 323/315
2004/0198291 A1 * 10/2004 Wilcox .................... H04B 1/44 455/269
2004/0211990 A1 * 10/2004 Asano ................... H01L 21/761 257/279
2007/0018247 A1 * 1/2007 Brindle ............. H01L 29/78609 257/347

(Continued)

*Primary Examiner* — Devan Sandiford
(74) *Attorney, Agent, or Firm* — Chang & Hale LLP

(57) ABSTRACT

A radio-frequency switch includes a series field-effect transistor, a shunt field-effect transistor having a gate node, and shunt arm control circuitry configured to receive an internal regulator voltage and provide the internal regulator voltage to the gate node of the shunt field-effect transistor when the radio-frequency switch is in a stand-by mode of operation.

20 Claims, 10 Drawing Sheets

624
SHUNT ARM
617
PFET
PFET
PFET
PFET
VREG
INTERNAL REGULATOR VOLTAGE

(56) References Cited

U.S. PATENT DOCUMENTS

2007/0069291 A1* 3/2007 Stuber ................. H01L 27/1203 257/347
2007/0103001 A1* 5/2007 Chiozzi ............ H03K 17/04106 307/10.1
2008/0064358 A1* 3/2008 Sagae ..................... H01L 21/84 455/333
2011/0050288 A1* 3/2011 Sagae .................. H03K 17/102 327/108
2011/0316062 A1* 12/2011 Kondo .................... H01L 29/93 257/312
2012/0267719 A1* 10/2012 Brindle ............. H01L 29/78609 257/348
2013/0194158 A1* 8/2013 Chen ........................ H01Q 1/50 343/876
2013/0293280 A1* 11/2013 Brindle ............. H01L 29/78609 327/382
2014/0009205 A1* 1/2014 Madan ................. H03K 17/162 327/379
2015/0054594 A1* 2/2015 Apriyana .................. H01P 1/15 333/103
2016/0043710 A1* 2/2016 Crandall ................ H03K 17/04 327/374
2016/0056978 A1* 2/2016 Zhu ..................... H04L 25/0266 455/83
2016/0065206 A1* 3/2016 Ho ....................... H03K 17/687 455/83
2016/0182037 A1* 6/2016 Srihari ................. H03K 17/693 343/858

* cited by examiner

FORWARD ISOLATION IN RADIO-FREQUENCY SWITCHES USING INTERNAL REGULATOR

CROSS-REFERENCE TO RELATED APPLICATIONS

This application is a continuation of U.S. patent application Ser. No. 14/839,774, filed Aug. 28, 2015, entitled SWITCH STAND-BY MODE ISOLATION IMPROVEMENT, which claims priority to U.S. Provisional Application No. 62/043,833, filed on Aug. 29, 2014, entitled SWITCH STAND-BY MODE ISOLATION IMPROVEMENT, the disclosures of which are hereby incorporated by reference in their entirety.

BACKGROUND

Field

The present disclosure generally relates to the field of electronics, and more particularly, to radio-frequency (RF) devices.

Description of Related Art

In RF devices, RF switching devices can be used to route electrical signals. RF isolation between can be an important parameter in certain RF devices.

SUMMARY

In some implementations, the present disclosure relates to a semiconductor die including a semiconductor substrate and a radio-frequency (RF) switch including one or more series field-effect transistors (FETs) and one or more shunt FETs, each of the one or more series FETs and one or more shunt FETs having a respective gate node, the RF switch being configured to receive an RF signal from a power amplifier module and provide the RF signal to an antenna. The semiconductor die may further include an internal regulator voltage source configured to provide an internal regulator voltage when the RF switch is in a stand-by mode and shunt arm control circuitry configured to provide the internal regulator voltage to the gate nodes of the one or more shunt FETs when the RF switch is in the stand-by mode.

In certain embodiments, the RF switch is in a stand-by mode when the power amplifier module is powered-down. The internal regulator voltage may be between 1.0 and 1.5 V.

The shunt arm control circuitry may be further configured to provide a voltage regulator voltage to the gate nodes of the one or more shunt FETs when the RF switch is in an active ON mode. Om certain embodiments, the shunt arm control circuitry is further configured to provide the voltage regulator voltage to the gate nodes of the one or more shunt FETs when the voltage regulator voltage is greater than the internal regulator voltage and to provide the internal regulator voltage to the gate nodes of the one or more shunt FETs when the voltage regulator voltage is less than the internal regulator voltage. The shunt arm control circuitry may be further configured to provide a negative voltage to the gate nodes of the one or more shunt FETs when the RF switch is in an active OFF mode.

In certain embodiments, the shunt arm control circuitry includes a plurality of pFETs connected in series. A drain or source of one of the plurality of pFETs may be connected to at least one of the gate nodes of the one or more shunt FETs. Furthermore, a gate of one of the plurality of pFETs is connected to a voltage regulator voltage that is greater than approximately 2.0 V when the power amplifier module is fully powered.

Certain embodiments disclosed herein provide a shunt arm control circuit for a switching device including a first input node connected to a voltage regulator voltage, a second input node connected to an internal regulator voltage, a third input node connected to a charge pump voltage, and connection circuitry configured to connect the first input node to gates one or more shunt FETs of a switching device when the switching device is in an active ON mode, to connect the second input node to the gates of the one or more shunt FETs when the switching device is in a stand-by mode, and to connect the third input node to the gates of the one or more shunt FETs when the switching device is in an active OFF mode.

In certain embodiments, the switching device is in the stand-by mode, the switching device is not fully powered. When the switching device is in the stand-by mode, the internal regulator voltage may be greater than the voltage regulator voltage. When the switching device is in the active ON mode or the active OFF mode, the switching device may be substantially powered-up. In certain embodiments, when the switching device is in the active ON mode or the active OFF mode, the voltage regulator voltage is greater than the internal regulator voltage.

The internal regulator voltage may be generated from a bandgap reference. In certain embodiments, the internal regulator voltage is between 1.0 and 1.5 V.

The shunt arm control circuit may further include a plurality of pFETs connected in series. In certain embodiments, a drain or source of one of the plurality of pFETs is connected to at least one of the gates of the one or more shunt FETs. A gate of another of the plurality of pFETs may be connected to the first node and a drain or source of the other of the plurality of pFETs may be connected to the second node.

In some implementations, the present disclosure relates to a radio-frequency (RF) device including a transceiver configured to generate an RF signal, a power amplifier (PA) in communication with the transceiver, the PA configured to amplify the RF signal, and an RF switch including one or more series field-effect transistors (FETs) and one or more shunt FETs, each of the one or more series FETs and one or more shunt FETs having a respective gate node, the RF switch being configured to receive the amplified RF signal and provide the amplified RF signal via the one or more series FETs. The RF device may further include an internal regulator voltage source configured to provide an internal regulator voltage when the RF switch is in a stand-by mode, shunt arm control circuitry configured to provide the internal regulator voltage to the gate nodes of the one or more shunt FETs when the RF switch is in the stand-by mode, and an antenna configured to receive the amplified RF signal and facilitate transmission of the amplified RF signal. In certain embodiments, the RF device includes a wireless device. The wireless device may be, for example, a cellular phone.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

Figure 1:
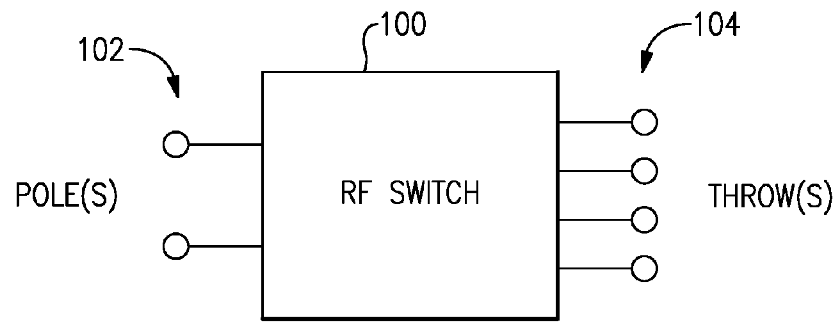
FIG. 1 is a diagram of a radio-frequency (RF) switch according to one or more embodiments.

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
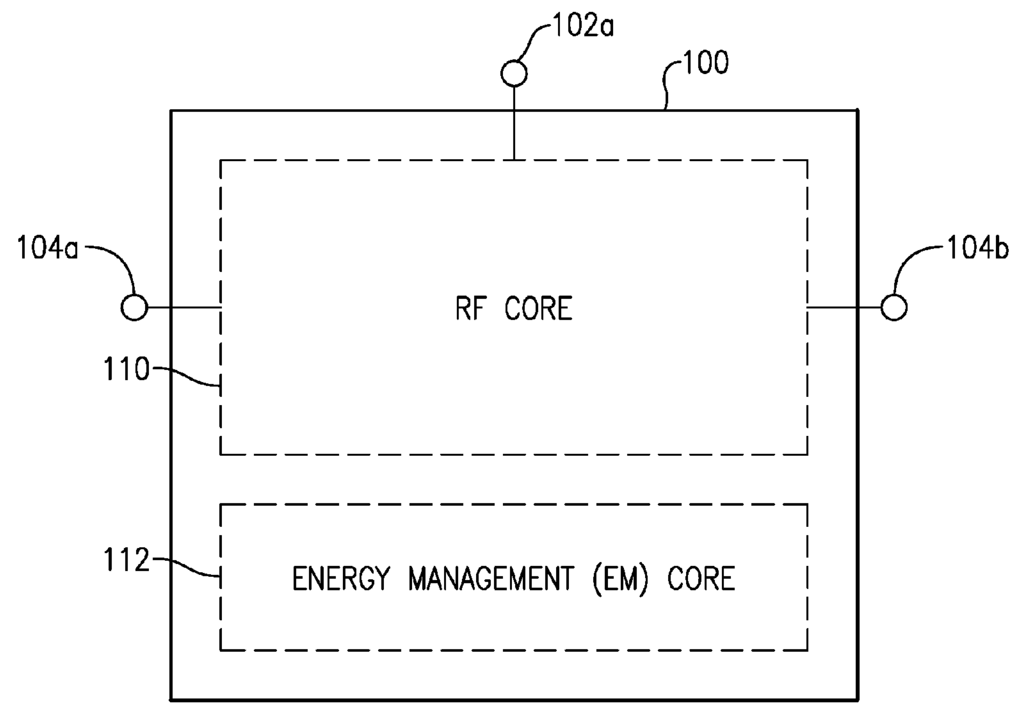
FIG. 2 is a diagram of a RF switch according to one or more embodiments.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102*a* and a first throw 104*a*, or the pole 102*a* and a second throw 104*b*.

In some embodiments, the EM core 112 can be configured to supply, for example, voltage control signals to the RF core 110. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration, as shown in FIG. 2.

Figure 3:
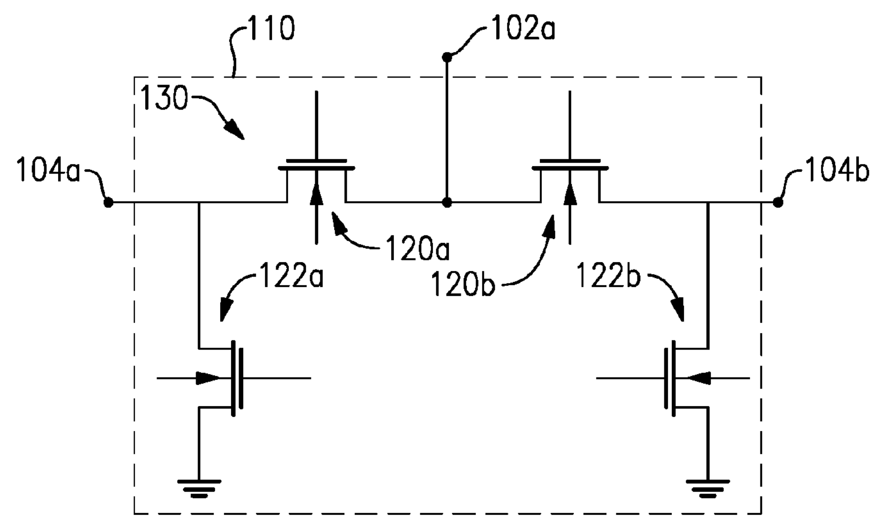
FIG. 3 is a diagram of an RF core of an RF switch according to one or more embodiments.

In the example SPDT context, FIG. 3 shows a more detailed example configuration of an RF core 110. The RF core 110 is shown to include a single pole 102*a* coupled to first and second throw nodes 104*a*, 104*b* via first and second transistors (e.g., FETs) 120*a*, 120*b*. The first throw node 104*a* is shown to be coupled to an RF ground via a FET 122*a* to provide shunting capability for the node 104*a*. Similarly, the second throw node 104*b* is shown to be coupled to the RF ground via a FET 122*b* to provide shunting capability for the node 104*b*.

In an example operation, when the RF core 110 is in a state where an RF signal is being passed between the pole 102*a* and the first throw 104*a*, the FET 120*a* between the pole 102*a* and the first throw node 104*a* can be in an ON state, and the FET 120*b* between the pole 102*a* and the second throw node 104*b* can be in an OFF state. For the shunt FETs 122*a*, 122*b*, the shunt FET 122*a* can be in an OFF state so that the RF signal is not shunted to ground as it travels from the pole 102*a* to the first throw node 104*a*. The shunt FET 122*b* associated with the second throw node 104*b* can be in an ON state so that any RF signals or noise arriving at the RF core 110 through the second throw node 104*b* is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one pole, and the number of throws can be less than or greater than the example number of two.

In the example of FIG. 3, the transistors between the pole 102*a* and the two throw nodes 104*a*, 104*b* are depicted as single transistors. In some implementations, such switching functionalities between the pole(s) and the throw(s) can be provided by switch arm segments, where each switch arm segment includes a plurality of transistors such as FETs.

Figure 4:
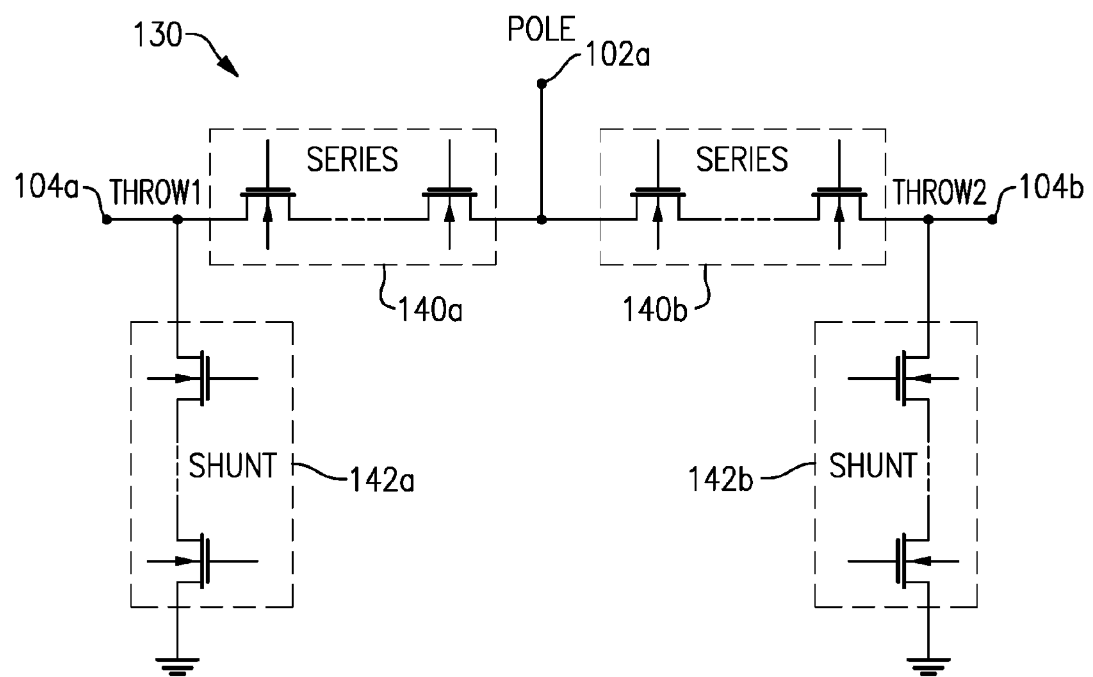
FIG. 4 is a diagram of an RF core of an RF switch according to one or more embodiments.

An example RF core configuration 130 of an RF core having switch arm segments is shown in FIG. 4. In the example, the pole 102*a* and the first throw node 104*a* are shown to be coupled via a first switch arm segment 140*a*. Similarly, the pole 102*a* and the second throw node 104*b* are shown to be coupled via a second switch arm segment 140*b*. The first throw node 104*a* is shown to be capable of being shunted to an RF ground via a first shunt arm segment 142*a*. Similarly, the second throw node 104*b* is shown to be capable of being shunted to the RF ground via a second shunt arm segment 142*b*.

In an example operation, when the RF core 130 is in a state where an RF signal is being passed between the pole 102*a* and the first throw node 104*a*, all of the FETs in the first switch arm segment 140*a* can be in an ON state, and all of the FETs in the second switch arm segment 104*b* can be in an OFF state. The first shunt arm 142*a* for the first throw node 104*a* can have all of its FETs in an OFF state so that the RF signal is not shunted to ground as it travels from the pole 102*a* to the first throw node 104*a*. All of the FETs in the second shunt arm 142*b* associated with the second throw node 104*b* can be in an ON state so that any RF signals or noise arriving at the RF core 130 through the second throw node 104*b* is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140*a*, 140*b*, 142*a*, 142*b*) can include one or more semiconductor transistors such as FETs. In some embodiments, an FET may be capable of being in a first state or a second state and can include a gate, a drain, a source, and a body (sometimes also referred to as a substrate. In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Examples of FET Structures and Fabrication Process Technologies

A switching device can be implemented on-die, off-die, or some combination thereof. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate-related RF losses. Electrically isolated SOI transistors can facilitate stacking, contributing to decreased chip size.

In some SOI FET configurations, each transistor can be configured as a finger-based device where the source and drain are rectangular shaped (in a plan view) and a gate structure extends between the source and drain like a rectangular shaped finger. FET devices described herein can include a p-type FET or an n-type FET. Thus, although some FET devices are described herein as p-type devices, it will be understood that various concepts associated with such p-type devices can also apply to n-type devices, and vice versa.

A pMOSFET can include an insulator layer formed on a semiconductor substrate. The insulator layer can be formed from materials such as silicon dioxide or sapphire. An n-well may be formed in the insulator such that the exposed surface generally defines a rectangular region. Source (S) and drain (D) may be p-doped regions whose exposed surfaces generally define rectangles. S/D regions can be configured so that source and drain functionalities are reversed. In certain embodiments, a gate (G) can be formed on the n-well so as to be positioned between the source and the drain.

In certain embodiments, a drain of one FET acts as a source of its neighboring FET. Thus, a multiple-finger FET device as a whole can provide a voltage-dividing functionality. For example, an RF signal can be provided at one of the outermost p-doped regions; and as the signal passes through the series of FETs, the signal's voltage can be divided among the FETs.

In some implementations, a plurality of multi-finger FET devices can be connected in series as a switch to, for example, further facilitate the voltage-dividing functionality. A number of such multi-finger FET devices can be selected based on, for example, power handling requirement of the switch.

Stand-by Mode Isolation

In certain switching devices and modules, OFF-state isolation is a performance parameter that can provide a measure of the RF isolation between an input port and an output port of an RF switch. In some embodiments, OFF-state isolation can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Isolation can be negatively affected by parasitic capacitances in transistor devices. For example, when a transistor 122*a* or 122*b* of FIG. 3 is in an OFF state, wherein drain-to-source current in the transistor is substantially inhibited, parasitic capacitances may exist between one or more terminals of the transistor, which can negatively impact performance of the RF core 110. Various parasitic capacitances of the transistors 120*a*, 120*b* may be created at least in part by the depletion regions between source/drain and bulk substrate of the transistors.

Certain embodiments of RF communications systems/modules include a switching device, as described above, configured to receive an RF input signal corresponding to an output signal of a power amplifier module, such as a GSM power amplifier module, for example. An example communication device including one or more power amplifier modules connected to one or more switching modules is described in further detail below with respect to FIG. 11. The output power from the power amplifier module(s) may be controlled at least in part by a Vramp signal that also controls the associated power-versus-time (PVT) mask.

At the beginning of a power-up sequences, the power amplifier module may desirably be configured to deliver no more than, for example, −55 dBm output power to an associated antenna port while the input power is, for example, 6 dBm. Such configurations and/or requirements may necessitate the utilization of relatively high-isolation switch(es). For example, certain switching devices as described herein may be configured to provide approximately 61 dB or more isolation.

High forward isolation performance in switching devices for power-up/stand-by mode isolation may be achieved in various ways. As one example, switching devices may be designed using HBT die having good isolation. However, such designs may be associated with certain simulation difficulties. Another example method may involve increasing isolation in the laminate. However, such designs may introduce undesirable size penalties and/or necessitate architectural modifications. In certain embodiments, switching between transmit (Tx) and receive (Rx) modes before the power amplifier module is powered on may improve stand-by mode isolation. However, such a configuration may require undesirable modifications in control logic.

Figure 5A:
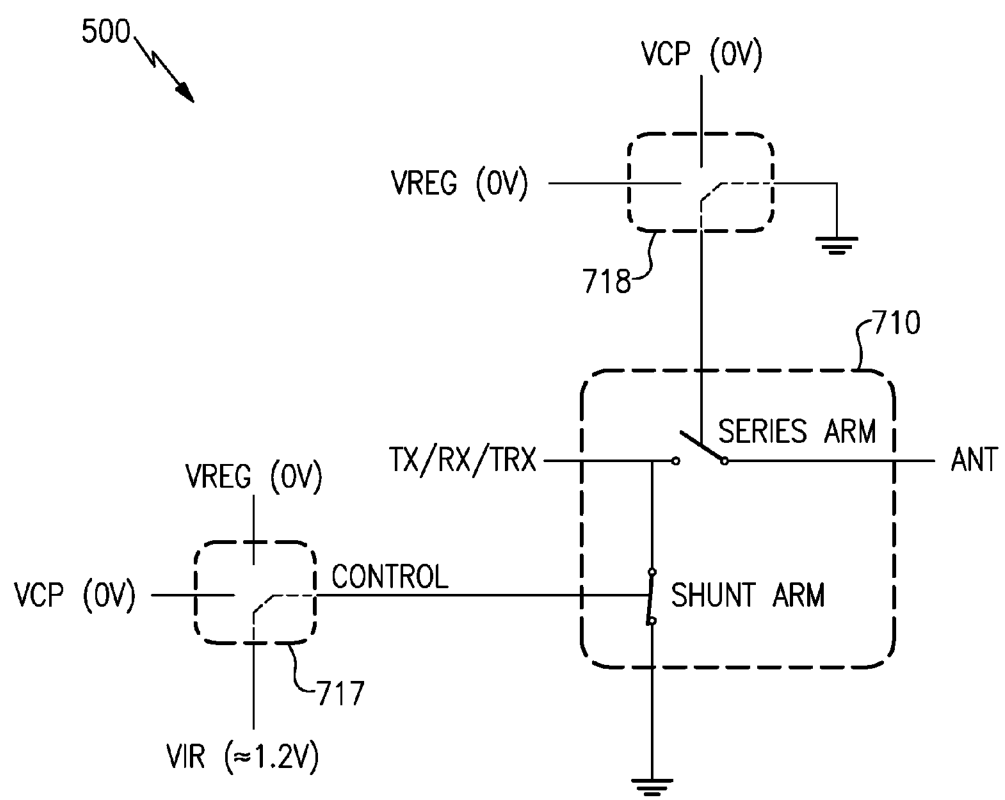
FIG. 5A is a diagram of an example switching device in a stand-by mode of operation according to certain embodiments of the present disclosure.
Figure 5B:
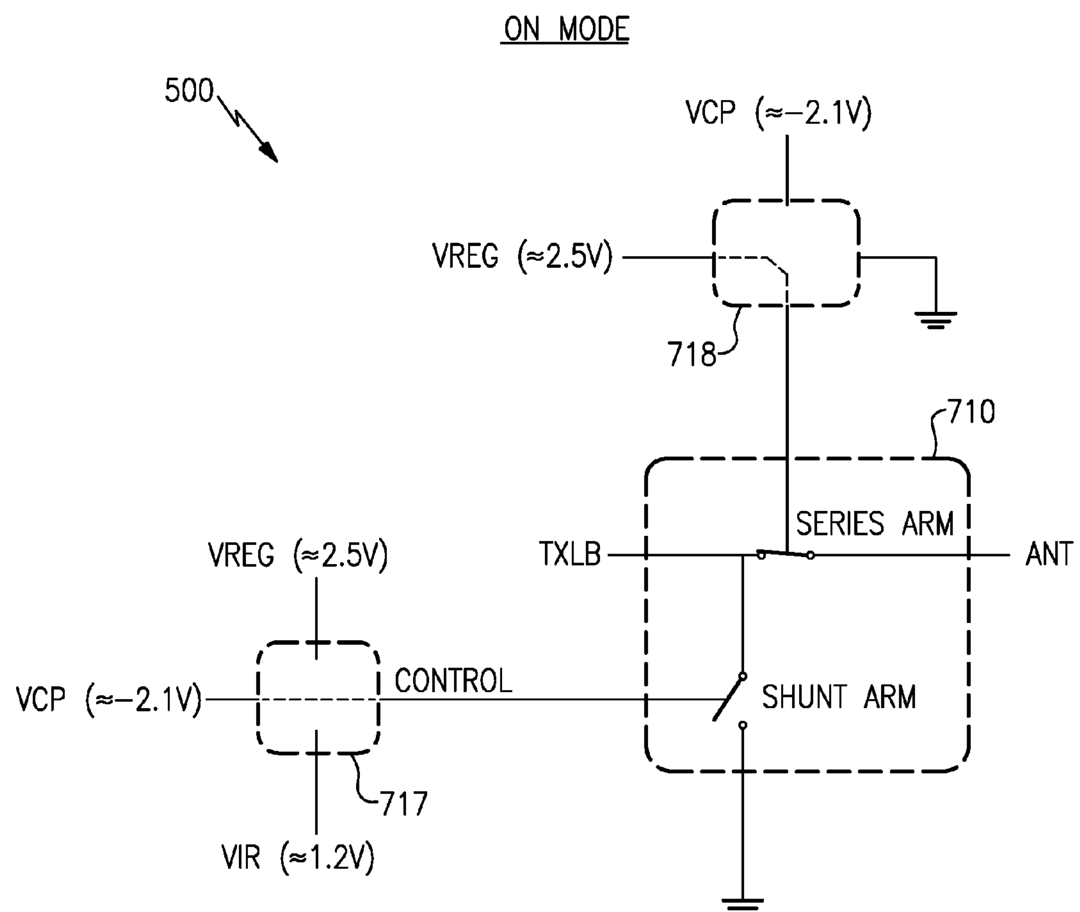
FIG. 5B is a diagram of an example switching device in an ON mode of operation according to certain embodiments of the present disclosure.
Figure 5C:
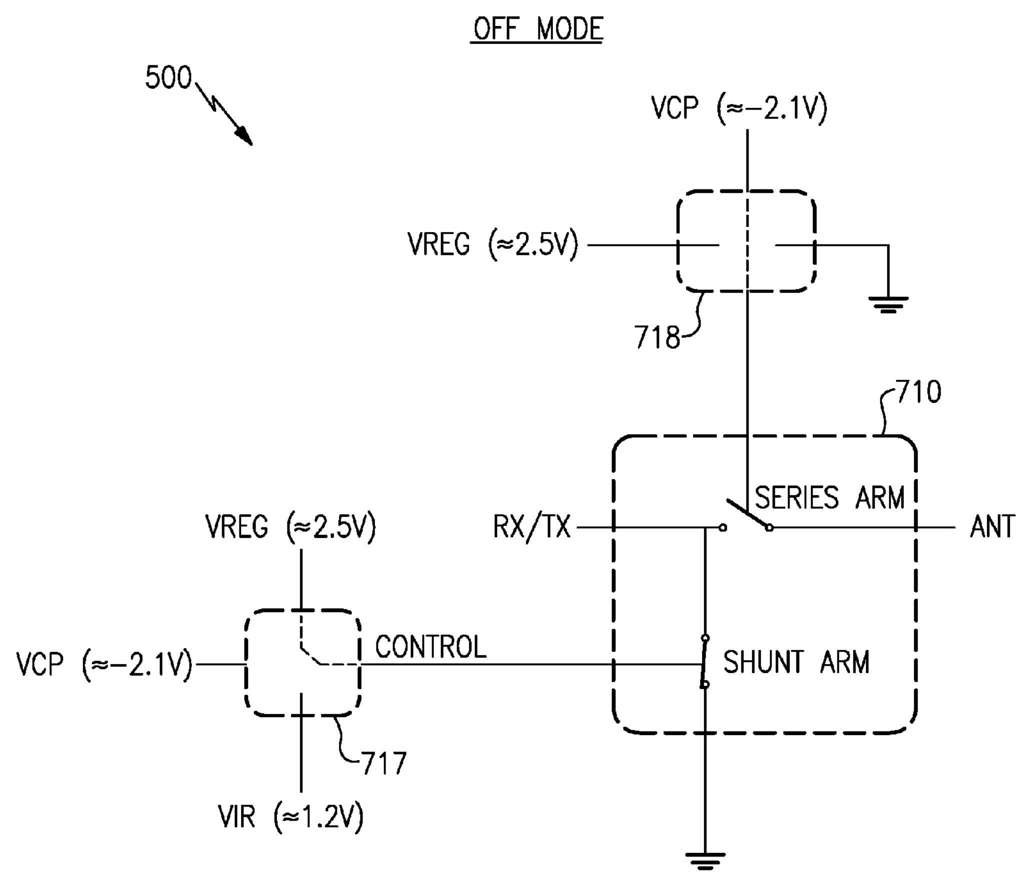
FIG. 5C is a diagram of an example switching device in an OFF mode of operation according to certain embodiments of the present disclosure.

Certain embodiments disclosed herein provide switch isolation improvement without requiring high-isolation HBT dies and/or laminates, through the implementation of stand-by (STB) mode isolation improvement in shunt arm gate voltage control circuitry. FIG. 5A is a diagram of an example switching device 500 including an RF core 710 having series and shunt switch arm segments. Although each of the series arm and the shunt arm of the RF core 710 shows only a single switch, such switch may comprise a plurality transistors, each having a respective gate. At a given time, the circuit 500 may be in an active or inactive state. In an active state, the circuit 500 is configured to receive a voltage regulation signal and/or a charge pump voltage signal, wherein the voltage regulation signal provides a gate voltage for turning one of the series and shunt arms ON, whereas the charge pump voltage signal may provide a gate voltage for turning the other of the series and shunt arms OFF. That is, the active state may comprise two states with respect to the RF core 710, an ON state, in which the series arm is ON and the shunt arm is OFF, and an OFF state, in which the shunt arm is ON and the series arm is OFF. Such OFF and On states are illustrated in FIGS. 5B and 5C. One or more of the transistors in the circuit 500 may be floating body transistors, which may allow for relatively quick switching performance. The charge pump voltage (Vcp) may be provided by a charge pump comprising a DC-to-DC converter configured to utilize one or more capacitors as energy storage elements for creating a low-voltage power source from the power supply rail.

The gates of the respective series and shunt arm transistors are controlled by a series arm control circuit 718 and a shunt arm control circuit 717, respectively. In particular, the series arm control circuit 718 may be configured to selectively connect the gate of one or more transistors of the series arm of the RF core 710 to a voltage regulator signal (Vreg) or a charge pump voltage (Vcp). In certain embodiments, the series arm control circuit 718 may be further configured to selectively connect the series gate(s) to ground. Vreg may be any desirable value designed to cause the series and/or gate transistor(s) to operate in a substantially ON state, wherein an electrical current can flow between drain and source nodes of the transistor(s). For example, during active operation, Vreg may have a value of approximately 2.3 V, 2.5 V, or some other value. The value of Vcp, on the other hand, may advantageously be less than or equal to 0 V. For example, Vcp may have a value of approximately −2.1 V in certain embodiments, or some other value.

In a stand-by state of operation, there may be substantially no voltage supplied at the Vreg and/or Vcp nodes. For example, the stand-by state may correspond to a state in which the switch device and/or an associated power amplifier module are substantially powered-down, or in a state of powering-up. As described above, it may be desirable in certain embodiments to activate the shunt arm of the RF core 710 during stand-by mode in order to improve stand-by isolation. However, without a substantial positive voltage available at the Vreg node, it may not be possible to sufficiently switch on the shunt arm transistor(s) using Vreg.

In certain embodiments, the circuit 500 may be configured to receive power for activating the shunt arm transistor(s) from a separate source other than Vreg in order to improve stand-by isolation. For example, certain embodiments disclosed herein provide utilization of an internal bandgap voltage regulator for activating shunt arm transistor(s) to improve stand-by isolation.

The internal regulator voltage may be derived from a bandgap voltage reference, which may provide a temperature-independent, substantially-fixed voltage. The internal regulator voltage may be substantially independent of power supply variations, temperature changes and/or device loading. The bandgap reference may provide an output voltage around 1.25 V, and may be derived from the voltage difference between semiconductor p-n junctions, which may be used to generate a proportional to absolute temperature (PTAT) current in a first resistor. This current may be used to generate a voltage in a second resistor. This voltage may in turn be added to the voltage of a junction. The ratio between the first and second resistors may be selected such that the first order effects of the temperature dependency of the junction and the PTAT current substantially cancel out. The resulting voltage may be approximately 1.2-1.3 V, depending on the particular technology and/or circuit design. In certain embodiments, the reference voltage is used to generate an internal regulator voltage of approximately 1.21 V. The internal regulator voltage may be available even when the voltage regulator Vreg is powered down.

FIG. 5A shows the stand-by mode operation according to certain embodiments of the present disclosure. As shown, in stand-by mode, the series arm transistor(s) of the RF core 710 may be OFF. Therefore, the series arm control circuit 718 may be tied to ground or otherwise be connected to a voltage signal at or near 0 V, which may produce a substantially open series arm circuit.

The shunt arm control circuit 717 may be configured to provide an internal regulator voltage (Vir) to the gate(s) of the shunt arm transistor(s) when the circuit 500 is in stand-by mode. The shunt arm control circuit 500 may be provided in parallel with an existing circuit, which provides a high voltage (Vreg) to control the shunt arm when the circuit 500 is in an OFF mode and a low voltage (Vcp) to control the shunt arm when the circuit 500 is in an ON state. In certain embodiments, the circuit 500 is configured to disconnect from the existing shunt arm control circuit during stand-by mode.

FIG. 5B illustrates the circuit 500 in an active ON mode of operation. In ON mode, the circuit 500 receives a high voltage (e.g., 2.5 V) at the Vreg node and such voltage is provided to the series arm transistor gate(s) of the RF core by the series arm control circuit 718 in order to turn on the series arm. Furthermore, the shunt arm control circuit 717 provides a low voltage (Vcp) to the shunt arm transistor gate(s) in order to turn off the shunt arm.

FIG. 5C illustrates the circuit 500 in an active OFF mode of operation. In OFF mode, the circuit 500 receives a high voltage (e.g., 2.5 V) at the Vreg node and such voltage is provided to the shunt arm transistor gate(s) of the RF core by the shunt arm control circuit 717 in order to turn on the shunt arm. Furthermore, the series arm control circuit 718 provides a low voltage (Vcp) to the series arm transistor gate(s) in order to turn off the series arm.

Figure 6:
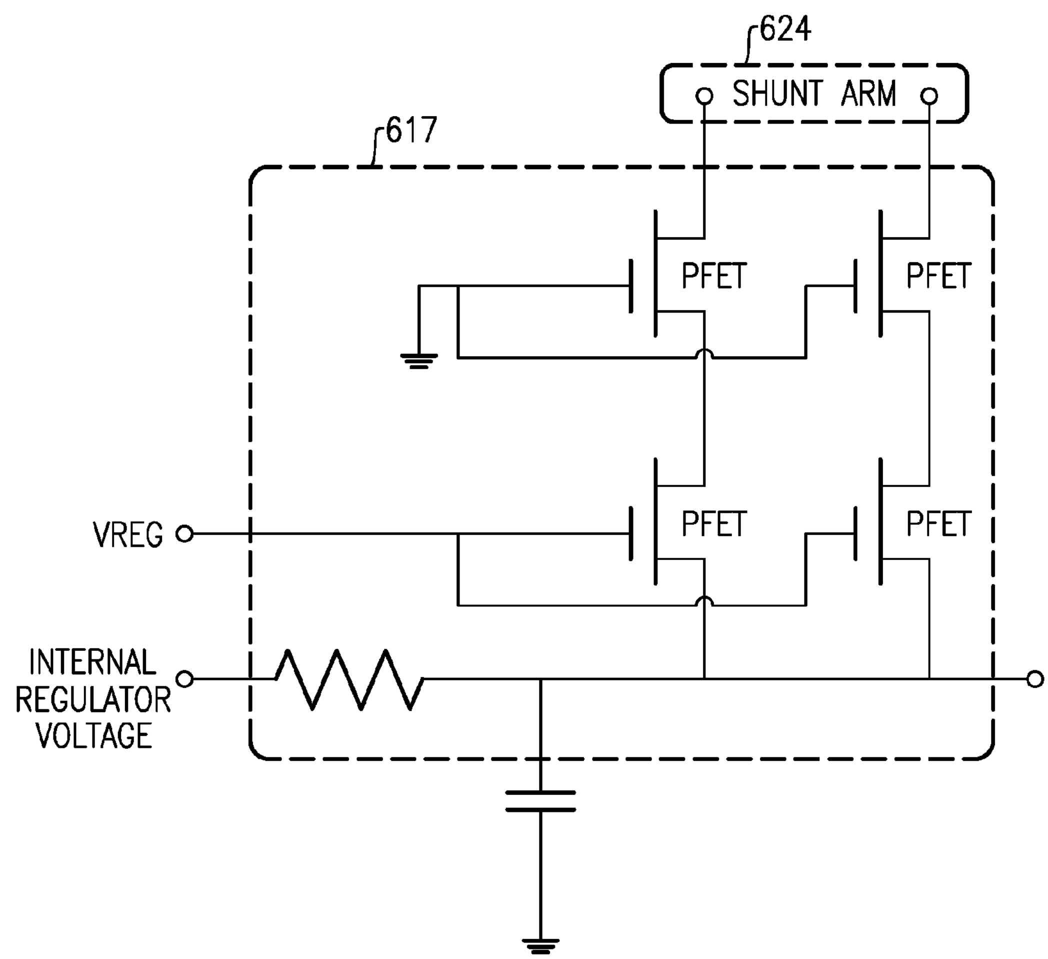
FIG. 6 is a diagram of a shunt arm control circuit in accordance with one or more embodiments.

FIG. 6 is a diagram of a shunt arm control circuit 617 in accordance with an embodiment. The circuit 617 may be used for floating-body switching to turn on the shunt arm 624 during stand-by mode, as described herein. In certain embodiments, the circuit 617 is configured in parallel with an existing shunt arm control circuit.

The circuit may include a first node configured to receive a voltage regulator signal Vreg. The circuit 617 further includes a second node configured to receive an internal regulator voltage. The circuit 617 may further include one or more nodes connected to one or more shunt arm transistor gates to provide a control signal thereto. The circuit 617 may be configured to provide the internal regulator voltage (e.g., 1.2 V) to the shunt arm when the voltage level Vreg is below a threshold value. For example, the circuit 617 may provide the internal regulator voltage to the shunt arm 624 when the voltage Vreg is less than the internal regulator voltage. Although the circuit 617 includes pFET transistors, it should be understood that the circuit may include other types of transistors in addition, or in alternative, to those shown in FIG. 6.

In certain embodiments, while in an active state, the shunt-arm will have Vreg (e.g., 2.5 V) or Vcp (e.g., −2.1) as gate voltages. Therefore, according to the configuration of FIG. 6, when the Vreg is powered-up (i.e., the circuit is in an active state), the circuit is effectively OFF, wherein a parallel Vreg or Vcp value may be provided to the shunt arm. When Vreg is powered-off, the circuit 617 may effectively be ON, wherein current may flow through the transistors. When the circuit 617 is ON, the internal regulator voltage may be provided to the shunt arm 624 through the transistors.

Figure 7:
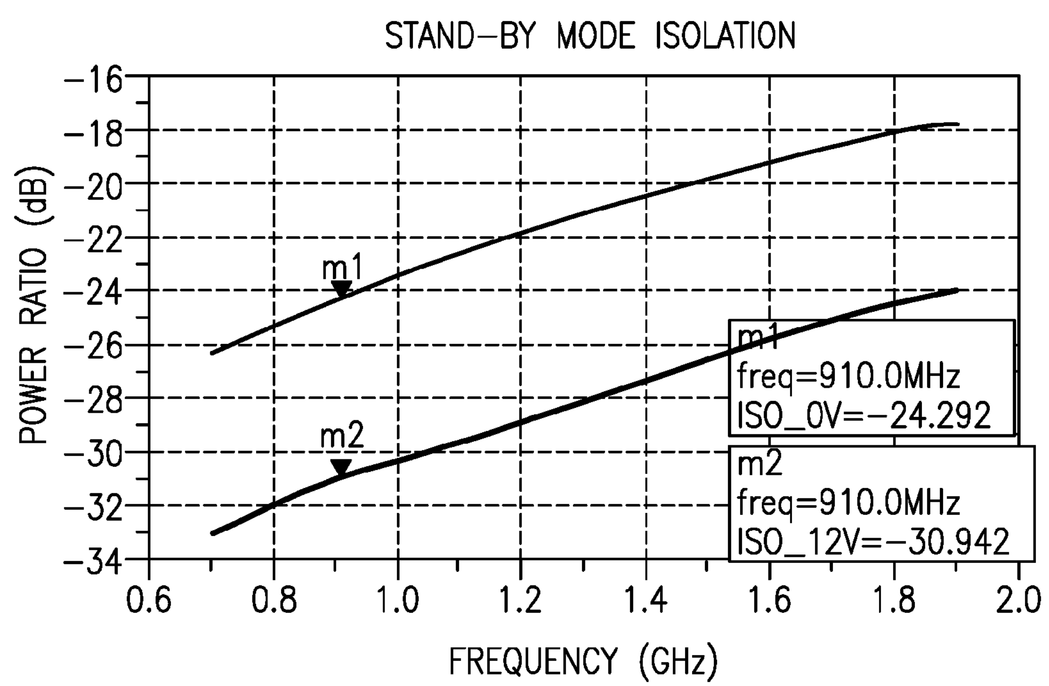
FIG. 7 is a graph illustrating potential performance values for stand-by mode isolation for a system incorporating stand-by mode isolation using an internal voltage regulator according to one or more embodiments.

FIG. 7 is a graph illustrating potential performance values for stand-by mode isolation for a system incorporating stand-by mode isolation using an internal voltage regulator, as disclosed herein. As shown, in certain embodiments, more than 6 dB isolation improvement may be achievable using principles disclosed herein.

Figure 8:
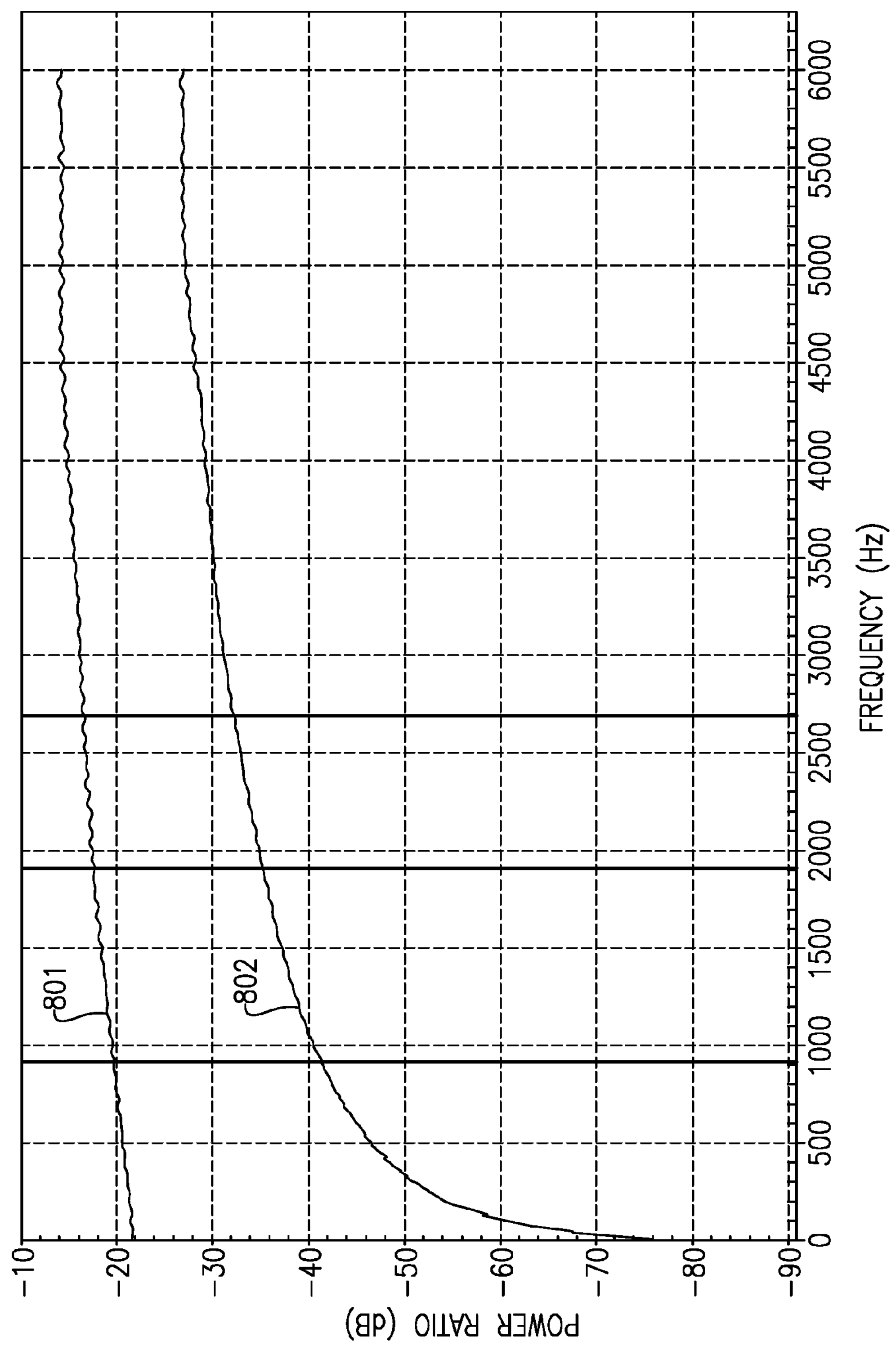
FIG. 8 is a graph showing possible improvement in performance for a front-end module implementing stand-by mode isolation according to one or more embodiments.

FIG. 8 is a graph showing possible improvement in performance for a front-end module implementing stand-by mode isolation, as disclosed herein, compared to a comparable system without such features. The curve 801, for example, may represent performance for a system not including stand-by mode isolation, whereas the curve 802 may represent performance for a system including stand-by mode isolation, as described herein.

Packaged Module Implementation

Figure 9A:
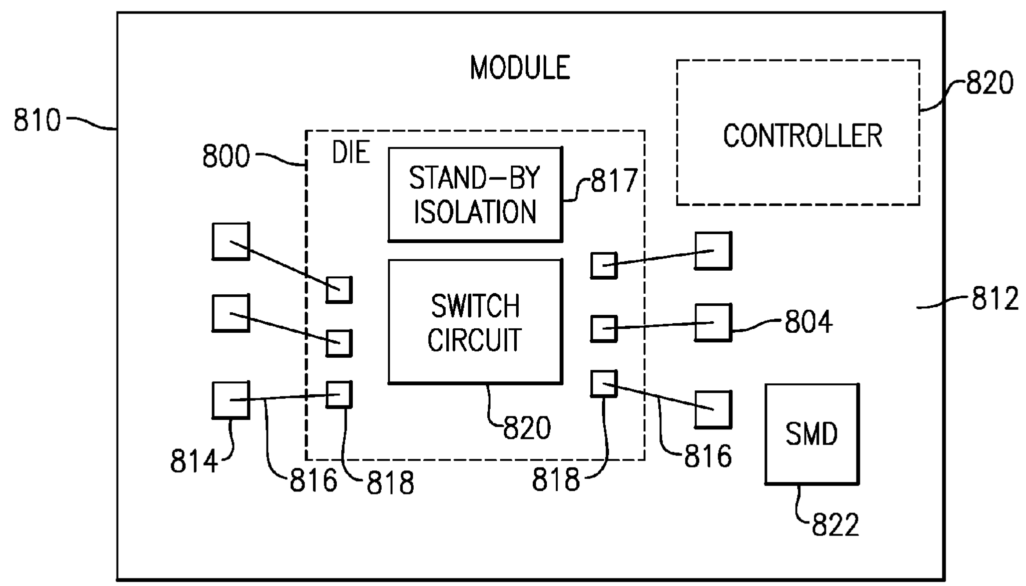
FIGS. 9A and 9B illustrate a plan view and side view, respectively, of an RF module according to one or more embodiments.
Figure 9B:
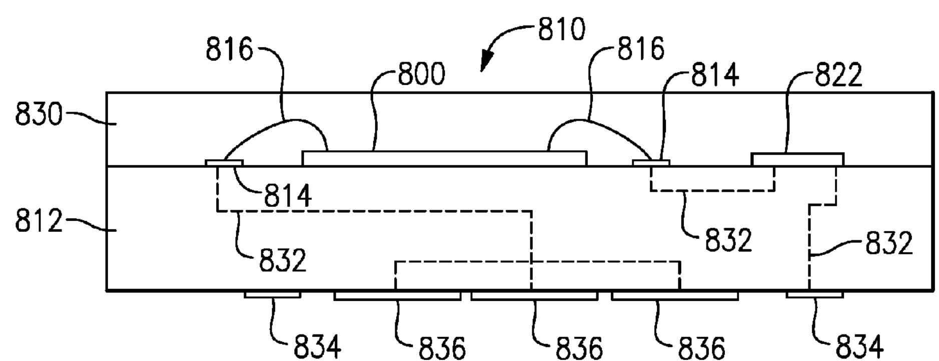

In some embodiments, one or more die having one or more features described herein can be implemented in a packaged module. An example of such a module is shown in FIGS. 9A (plan view) and 9B (side view). A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 820 and a stand-by mode isolation circuit 817 is shown to be mounted on the packaging substrate 812. The die 800 can be electrically connected to other parts of the module (and with each other where more than one die is utilized) through connections, such as connection-wirebonds 816. Such connection wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example, a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
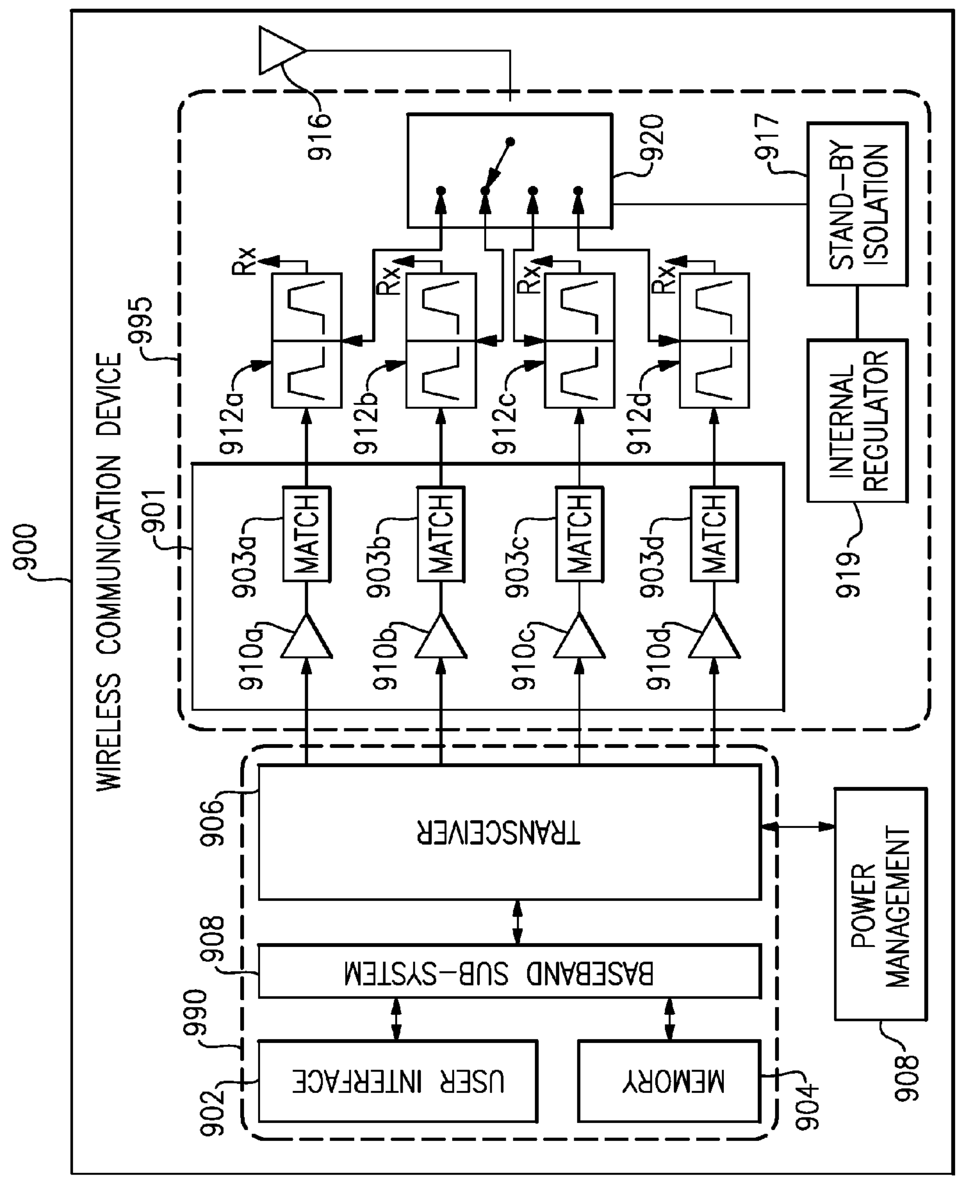
FIG. 10 schematically depicts an example wireless communication device having one or more advantageous features described herein according to an embodiment.

FIG. 10 schematically depicts an example wireless communication device 900 having one or more advantageous features described herein. The wireless communication device 900 may include both RF components 995 and baseband components 990. In certain embodiments, the wireless communication device 900 may include one or more switch devices having stand-by mode isolation circuitry associated therewith according to one or more embodiments disclosed herein. In some embodiments, such a switching device configuration can provide improved stand-by mode isolation.

In the example wireless device 900, a power amplifier (PA) module 901 having a plurality of PAs can provide an amplified RF signal to a switch 920, and the switch 920 can route the amplified RF signal to an antenna 916. In certain embodiments, the switch 920 is connected to stand-by isolation circuitry 917, which may provide an internal regulator voltage 919 to the switch 920 during stand-by mode of the switch and/or power amplifier module 901.

The PA module 901 can receive an unamplified RF signal from a transceiver 906 that can be configured and operated in a known manner. The transceiver 906 can also be configured to process received signals. The transceiver 906 is shown to interact with a baseband sub-system 908 that is configured to provide conversion between data and/or voice signals suitable for a user and RF signals suitable for the transceiver 906. The transceiver 906 is also shown to be connected to a power management component 906 that is configured to manage power for the operation of the wireless device 900. Such a power management component can also control operations of various components of the wireless communication device 900.

The switch device 920 may be connected to and/or associated with a stand-by isolation circuit 917, as described in detail herein. The stand-by isolation circuit 917 may be configured to receive a signal from an internal regulator, such as a bandgap voltage, and provide the internal regulator voltage to one or more gates of shunt arm(s) of the switching device 920.

The baseband sub-system 908 is shown to be connected to a user interface 902 to facilitate various input and output of voice and/or data provided to and received from the user. The baseband sub-system 908 can also be connected to a memory 904 that is configured to store data and/or instructions to facilitate the operation of the wireless device, and/or to provide storage of information for the user.

In some embodiments, a duplexer 912*a*-912*d* can allow transmit and receive operations to be performed simultaneously using a common antenna (e.g., 916). In FIG. 11, received signals are shown to be routed to "Rx" paths (not shown) that can include, for example, one or more low-noise amplifiers (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:

a series field-effect transistor;

a shunt field-effect transistor having a gate node; and shunt arm control circuitry configured to receive an internal regulator voltage and provide the internal regulator voltage to the gate node of the shunt field-effect transistor when the radio-frequency switch is in a stand-by mode of operation.

2. The radio-frequency switch of claim 1 wherein said providing the internal regulator voltage to the gate node of the shunt field-effect transistor causes the shunt field-effect transistor to be in an ON state.

3. The radio-frequency switch of claim 1 wherein the internal regulator voltage is between 1.0 and 1.5 V.

4. The radio-frequency switch of claim 1 wherein the shunt arm control circuitry is further configured to receive a voltage regulator voltage and provide the voltage regulator voltage to the gate node of the shunt field-effect transistor when the radio-frequency switch is in an active OFF mode of operation.

5. The radio-frequency switch of claim 4 wherein the shunt arm control circuitry is further configured to provide the voltage regulator voltage to the gate node of the shunt field-effect transistor when the voltage regulator voltage is greater than the internal regulator voltage and to provide the internal regulator voltage to the gate node of the shunt field-effect transistor when the voltage regulator voltage is less than the internal regulator voltage.

6. The radio-frequency switch of claim 4 wherein the shunt arm control circuitry is further configured to receive a charge pump voltage and provide the charge pump voltage to the gate node of the shunt field-effect transistor when the radio-frequency switch is in the active ON mode of operation.

7. The radio-frequency switch of claim 4 wherein the shunt arm control circuitry comprises a control field-effect transistor, the control field-effect transistor having a gate configured to receive at least a portion of the voltage regulator voltage and a drain or source configured to receive at least a portion of the internal regulator voltage.

8. The radio-frequency switch of claim 7 wherein the control field-effect transistor is one transistor of a transistor stack coupled to the gate of the shunt field-effect transistor.

9. A method of operating a radio-frequency switch comprising:

receiving a voltage regulator voltage at a first input node;

receiving an internal regulator voltage at a second input node;

receiving a charge pump voltage at a third input node; and providing the internal regulator voltage from the second input node to a gate of a shunt field-effect transistor of a radio-frequency switch when the radio-frequency switch is in a stand-by mode of operation.

10. The method of claim 9 further comprising providing the voltage regulator voltage from the first input node to the gate of the shunt field-effect transistor when the radio-frequency switch is in an active OFF mode of operation.

11. The method of claim 10 further comprising providing the charge pump voltage from the third input node to the gate of the shunt field-effect transistor when the radio-frequency switch is in an active ON mode.

12. The method of claim 11 wherein, when the radio-frequency switch is in the active ON mode or the active OFF mode, the voltage regulator voltage is greater than the internal regulator voltage.

13. The method of claim 11 wherein, when the radio-frequency switch is in the active ON mode or the active OFF mode, the radio-frequency switch is powered-up.

14. The method of claim 9 wherein, when the radio-frequency switch is in the stand-by mode of operation, the radio-frequency switch is not fully powered.

15. The method of claim 9 wherein, when the radio-frequency switch is in the stand-by mode of operation, the internal regulator voltage is greater than the voltage regulator voltage.

16. The method of claim 9 wherein the internal regulator voltage is generated from a bandgap reference.

17. A method of fabricating a semiconductor die comprising:

forming a series field-effect transistor of a radio-frequency switch on a semiconductor substrate;

forming a shunt field-effect transistor of the radio-frequency switch on the semiconductor substrate, the shunt field-effect transistor having a gate node; and coupling the gate node of the shunt field-effect transistor to an output node of shunt arm control circuitry that is configured to receive an internal regulator voltage on an internal regulator voltage input and provide the internal regulator voltage on the output node when the radio-frequency switch is in a stand-by mode of operation.

18. The method of claim 17 wherein the shunt arm control circuitry is further configured to receive a voltage regulator voltage on a voltage regulator voltage input and to provide the voltage regulator voltage on the output node when the radio-frequency switch is in an OFF mode of operation.

19. The method of claim 18 wherein the output node is coupled to a drain or source of a first transistor of the shunt arm control circuitry, the voltage regulator voltage input being coupled to a gate of a second transistor of the shunt arm control circuitry.

20. The method of claim 19 wherein the internal regulator voltage input is coupled to a drain or source of the second transistor.

* * * * *